(12) United States Patent
Hong et al.

(10) Patent No.: US 11,262,409 B2
(45) Date of Patent: Mar. 1, 2022

(54) BATTERY MANAGEMENT APPARATUS AND METHOD

(71) Applicant: LG CHEM, LTD., Seoul (KR)

(72) Inventors: Sung-Ju Hong, Daejeon (KR);
Dong-Hyun Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 46 days.

(21) Appl. No.: 16/770,425

(22) PCT Filed: Oct. 11, 2019

(86) PCT No.: PCT/KR2019/013387
§ 371 (c)(1),
(2) Date: Jun. 5, 2020

(87) PCT Pub. No.: WO2020/076127
PCT Pub. Date: Apr. 16, 2020

(65) Prior Publication Data
US 2020/0386821 A1 Dec. 10, 2020

(30) Foreign Application Priority Data

Oct. 12, 2018 (KR) .......................... 10-2018-0122136

(51) Int. Cl.
*G01R 19/165* (2006.01)
*G01R 31/3835* (2019.01)
(Continued)

(52) U.S. Cl.
CPC ............ *G01R 31/3835* (2019.01); *B60K 6/24* (2013.01); *B60L 50/50* (2019.02); *B60L 58/10* (2019.02);
(Continued)

(58) Field of Classification Search
CPC .. B60K 6/24; B60K 6/34; B60L 50/50; B60L 58/10; B60L 2240/54; B60L 2240/547;
(Continued)

(56) References Cited

U.S. PATENT DOCUMENTS

2009/0295399 A1   12/2009   Ueda et al.
2010/0224157 A1    9/2010   Mizuno
(Continued)

FOREIGN PATENT DOCUMENTS

EP   2 485 364 A1   8/2012
EP   3 043 413 A1   7/2016
(Continued)

OTHER PUBLICATIONS

International Search Report issued in corresponding International Patent Application No. PCT/KR2019/013387, dated Jan. 22, 2020.
(Continued)

*Primary Examiner* — Huy Q Phan
*Assistant Examiner* — Courtney G McDonnough
(74) *Attorney, Agent, or Firm* — Morgan, Lewis & Bockius LLP

(57) ABSTRACT

A battery management apparatus, including: a sensing unit configured to measure a pack voltage value of a battery pack configured to be charged by receiving a charging current from an engine, output a starting current to turn on the engine, and output an operating current to operate electronic components, and a processor configured to: set a first voltage region by using a first current value (CV) of the charging current and an internal resistance value (IRV) of the battery pack, set a second voltage region by using a second CV of the starting current and the IRV, set a third voltage region by using a third CV of the operating current and the IRV, calculate a voltage change amount of the pack voltage value, compare the first, second, and third voltage regions with the
(Continued)

voltage change amount, and determine whether the battery pack is charged or discharged.

10 Claims, 2 Drawing Sheets

(51) Int. Cl.
    *B60L 50/50*         (2019.01)
    *B60L 58/10*         (2019.01)
    *B60K 6/24*          (2007.10)
    *G01R 31/36*        (2020.01)

(52) U.S. Cl.
    CPC ....... *G01R 19/165* (2013.01); *G01R 31/3648* (2013.01); *B60L 2240/54* (2013.01); *B60Y 2200/90* (2013.01)

(58) Field of Classification Search
    CPC . B60L 2240/549; G01R 19/165; G01R 31/36; G01R 31/3835; G01R 19/16576; G01R 31/3648; G01R 31/3842; H01M 10/425; H01M 10/482; H01M 2010/4271; H02J 7/0047; H02J 2310/48; B60Y 2200/90; B60Y 2200/91; B60Y 2200/92; Y02E 60/10
    USPC ........ 324/433; 320/112, 124, 127, 137, 152, 320/157, 159, 164
    See application file for complete search history.

(56) References Cited

U.S. PATENT DOCUMENTS

| | | | |
|---|---|---|---|
| 2012/0187908 A1 | 7/2012 | Tanigawa et al. | |
| 2015/0111076 A1 | 4/2015 | Suzuki | |
| 2015/0303532 A1 | 10/2015 | Fink | |
| 2016/0218544 A1 | 7/2016 | Ogihara | |
| 2018/0003774 A1 | 1/2018 | Iida et al. | |

FOREIGN PATENT DOCUMENTS

| | | | |
|---|---|---|---|
| JP | H05-199668 A | 8/1993 |
| JP | 11-38107 A | 2/1999 |
| JP | 2004-25982 A | 1/2004 |
| JP | 2006-047130 A | 2/2006 |
| JP | 2006-180665 A | 7/2006 |
| JP | 2009-274527 A | 11/2009 |
| JP | 2010-52582 A | 3/2010 |
| JP | 2010-125907 A | 6/2010 |
| JP | 2011-097729 A | 5/2011 |
| JP | 4844044 B2 | 12/2011 |
| JP | 4919120 B2 | 4/2012 |
| JP | 2013-088183 A | 5/2013 |
| JP | 2015-082350 A | 4/2015 |
| KR | 1999-011521 U | 3/1999 |
| KR | 10-2013-0142807 A | 12/2013 |
| KR | 10-1418883 B1 | 7/2014 |
| KR | 10-1653967 B1 | 9/2016 |
| KR | 10-2018-0007034 A | 1/2018 |

OTHER PUBLICATIONS

Extended European Search Report dated Feb. 23, 2021, issued in corresponding European Patent Application No. 19871300.0.
Office Action dated Aug. 16, 2021, issued in corresponding Japanese Patent Application No. 2020-556215.

BATTERY MANAGEMENT APPARATUS AND METHOD

TECHNICAL FIELD

The present application claims priority to Korean Patent Application No. 10-2018-0122136 filed on Oct. 12, 2018 in the Republic of Korea, the disclosures of which are incorporated herein by reference.

The present disclosure relates to a battery management apparatus and method, and more particularly, to a battery management apparatus and method for determining a charged or discharged state of a battery pack based on a voltage change amount of a pack voltage value measured from the battery pack.

BACKGROUND ART

Recently, due to the depletion of fossil energy and environmental pollution, there is a growing interest in electrical products that may be driven using electrical energy without using fossil energy.

Accordingly, the development and demand for technology of mobile devices, electric vehicles, hybrid electric vehicles, power storage devices and uninterruptible power supplies increase. For this reason, the demand for secondary batteries as energy sources is rapidly increasing, and the types of demand are also diversifying. Thus, many researches on secondary batteries have been conducted to meet various demands.

In general, the secondary batteries include nickel cadmium batteries, nickel hydrogen batteries, lithium ion batteries, and lithium ion polymer batteries. The secondary batteries are classified into lithium-based batteries and nickel hydrogen-based batteries. The lithium-based batteries are mainly applied to small products such as digital cameras, P-DVDs, MP3Ps, mobile phones, PDAs, portable game devices, power tools, and e-bikes. Also, the nickel hydrogen-based batteries are applied to large products demanding a high output such as electric vehicles and hybrid electric vehicles.

Meanwhile, a battery management device for managing the secondary battery includes a current sensor for measuring a current of the secondary battery in order to manage charging and discharging of the secondary battery and estimate a state of charge (SOC) thereof.

Among various battery management devices, some battery management devices simply requires to check whether the current of the secondary battery is a charging current or a discharge current. In this case, an accurate current value may be measured and the manufacturing cost of the battery pack increases if a current sensor is used. Thus, there is a demand for a technology that may check whether the current of the secondary battery is a charging current or a discharge current without an expensive current sensor.

DISCLOSURE

Technical Problem

The present disclosure is designed to solve the problems of the related art, and therefore the present disclosure is directed to providing a battery management apparatus and method, which may set a first voltage region, a second voltage region and a third voltage region by using a charging current, a starting current and an operating current, respectively, and determine whether a battery pack is in a charged or discharged state based on a comparison result of a voltage change amount of a pack voltage value with the first voltage region, the second voltage region and the third voltage region.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure to accomplish the above object are as follows.

A battery management apparatus according to the present disclosure may comprise: a sensing unit configured to measure a pack voltage value of a battery pack that is charged by receiving a charging current generated from an engine, outputs a starting current to turn on the engine and outputs an operating current to operate electronic components; and a processor operably coupled to the sensing unit.

Preferably, the processor may set a first voltage region by using a first current value of the charging current and an internal resistance value of the battery pack, set a second voltage region by using a second current value of the starting current and the internal resistance value of the battery pack, set a third voltage region by using a third current value of the operating current and the internal resistance value of the battery pack, calculate a voltage change amount of the pack voltage value, compare the first voltage region, the second voltage region and the third voltage region with the voltage change amount, and determine whether the battery pack is in a charged or discharged state based on the comparison result.

Preferably, the processor may calculate a pack voltage value difference between the pack voltage value at a start point of a preset unit period and the pack voltage value at an end point of the preset unit period, at every preset unit period.

Preferably, the processor may calculate an average of an n number of recently calculated pack voltage value differences among the calculated pack voltage value differences as the voltage change amount.

Preferably, the processor may determine that the battery pack is in a charged state for receiving the charging current, when the voltage change amount is included in the first voltage region.

Preferably, the processor may determine that the battery pack is in an operating discharged state for outputting the operating current to the electronic components, when the voltage change amount is included in the third voltage region.

Preferably, the processor may determine that the battery pack is in a starting discharged state for outputting the starting current to turn on the engine, when the voltage change amount is included in the second voltage region.

Preferably, a minimum voltage value of the first voltage region may be greater than a maximum voltage value of the third voltage region, and a minimum voltage value of the third voltage region may be greater than a maximum voltage value of the second voltage region.

A battery pack according to the present disclosure may comprise the battery management apparatus.

A vehicle according to the present disclosure may comprise the battery management apparatus.

A battery management method according to the present disclosure may use a battery management apparatus including: a sensing unit configured to measure a pack voltage value of a battery pack that is charged by receiving a charging current generated from an engine, outputs a starting current to turn on the engine and outputs an operating current to operate electronic components; and a processor operably coupled to the sensing unit.

The battery management method may comprise: by the processor, setting a first voltage region by using a first current value of the charging current and an internal resistance value of the battery pack; by the processor, setting a second voltage region by using a second current value of the starting current and the internal resistance value of the battery pack; by the processor, setting a third voltage region by using a third current value of the operating current and the internal resistance value of the battery pack; by the processor, calculating a voltage change amount of the pack voltage value; and by the processor, comparing the first voltage region, the second voltage region and the third voltage region with the voltage change amount, and determining whether the battery pack is in a charged or discharged state based on the comparison result.

Preferably, the step of calculating a voltage change amount may include: calculating a pack voltage value difference between the pack voltage value at a start point of a preset unit period and the pack voltage value at an end point of the preset unit period, at every preset unit period; and calculating an average of an n number of recently calculated pack voltage value differences among the calculated pack voltage value differences as the voltage change amount.

Advantageous Effects

According to at least one of embodiments of the present disclosure, it is possible to determine whether the battery pack is in a charged or discharged state without using an expensive current sensor.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
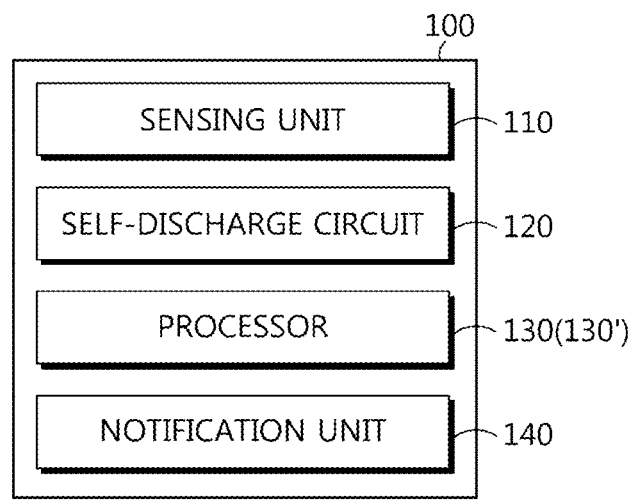
FIG. 1 is a block diagram showing a functional configuration of a battery management apparatus according to an embodiment of the present disclosure.
Figure 2:
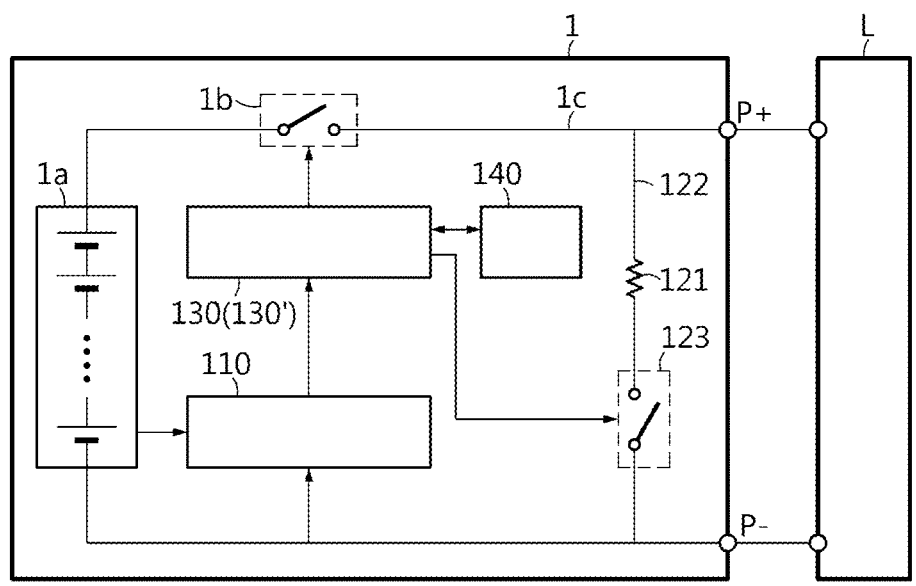
FIG. 2 is a circuit diagram showing a functional configuration of the battery management apparatus according to an embodiment of the present disclosure and a battery pack including the battery management apparatus.
Figure 3:
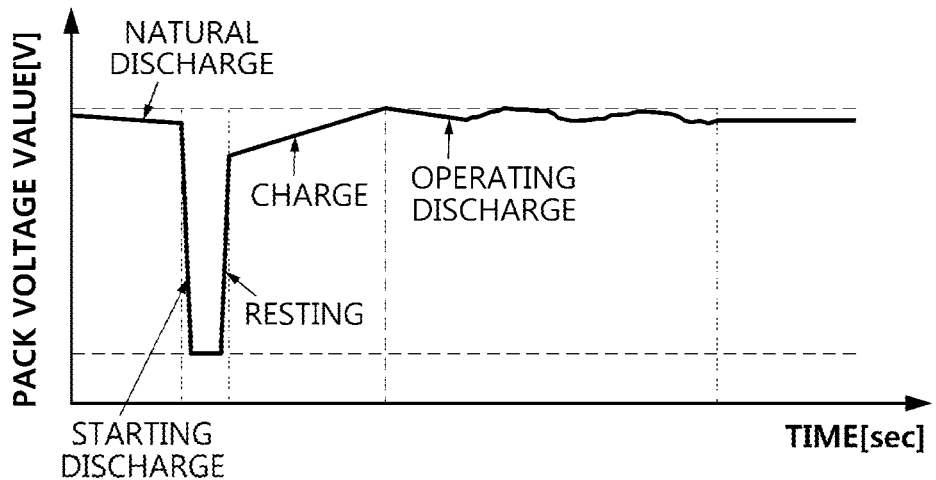
FIG. 3 is a graph showing a pack voltage value of the battery pack according to time.

FIG. 1 is a block diagram showing a functional configuration of a battery management apparatus according 100 to an embodiment of the present disclosure, FIG. 2 is a circuit diagram showing a functional configuration of the battery management apparatus 100 according to an embodiment of the present disclosure and a battery pack 1 including the battery management apparatus 100, and FIG. 3 is a graph showing a pack voltage value of the battery pack 1 according to time.

Referring to FIGS. 1 to 3, the battery pack 1 may include a battery management apparatus 100 according to an embodiment of the present disclosure, a cell assembly 1a, a charging and discharging switch 1b, a charging and discharging path 1c and input and output terminals P+, P−.

The battery pack 1 is mounted to a vehicle that runs using an engine. The battery pack 1 may be charged by receiving a charging current generated from the engine, output a starting current to turn on the engine and output an operating current to operate electronic components L.

For this purpose, the input and output terminals P+, P− of the battery pack 1 may be electrically connected to an unregulator L of the engine to receive the charging current. In addition, the input and output terminals P+, P− of the battery pack 1 may be electrically connected to a starting motor L of the vehicle to output the starting current. Also, the input and output terminals P+, P− of the battery pack 1 may be electrically connected to the electronic components L of the vehicle to output the operating current.

The cell assembly 1a may include a plurality of battery cells. The cell assembly 1a may be electrically connected to the input and output terminals P+, P− through the charging and discharging path 1c. Through this, the cell assembly 1a may be charged or discharged by receiving or outputting a current through the charging and discharging path 1c while the charging and discharging switch 1b positioned on the charging and discharging path 1c is turned on. In contrast, the cell assembly 1a may stop charging and discharging while the charging and discharging switch 1b is turned off.

The charging and discharging switch 1b may be controlled by a processor 130 of the battery management apparatus 100, explained later, so that its operation state comes to a turn-on or turn-off state.

The battery management apparatus 100 according to an embodiment of the present disclosure may include a sensing unit 110, a self-discharge circuit 120, a processor 130, and a notification unit 140.

The sensing unit 110 is implemented using application specific integrated circuits (ASICs) or the like and may measure a pack voltage value of the battery pack 1.

Here, the pack voltage value of the battery pack 1 may mean a voltage applied to both ends of the cell assembly 1a. Accordingly, the sensing unit 110 may be electrically connected to the cell assembly 1a to measure the pack voltage value. To this end, the sensing unit 110 may have at least one voltage sensor (not shown).

The sensing unit 110 may output a signal indicating the measured pack voltage value to the processor 130.

The processor 130 may be operably coupled to the sensing unit 110.

The processor 130 may set a first voltage region by using a first current value of the charging current generated from the engine and an internal resistance value of the battery pack 1. Here, the first current value of the charging current may be a preset output current value of the unregulator L. In addition, the internal resistance value of the battery pack 1 may be a resistance value predetermined through a charge and discharge experiment.

The processor 130 may calculate a product of the first current value and the internal resistance value as the first voltage value, add a preset reference voltage value to the first voltage value to set a maximum voltage value of the first voltage region, and subtract the preset reference voltage value from the first voltage value to set a minimum voltage value of the first voltage region.

The processor 130 may set a second voltage region by using a second current value of the starting current output to the starting motor L to turn on the engine and the internal resistance value of the battery pack 1. Here, the second current value of the starting current may be a preset current value that is a current value of the current to be output to the starting motor L to turn on the engine.

The processor 130 may calculate a product of the second current value and the internal resistance value as a second voltage value, add the preset reference voltage value to the second voltage value to set a maximum voltage value of the second voltage region, and subtract the preset reference voltage value from the second voltage value to set a minimum voltage value of the second voltage region.

The processor 130 may set a third voltage region by using a third current value of the operating current outputted to operate the electronic components L and the internal resistance value of the battery pack 1. Here, the third current value of the operating current may be a preset current value consumed by the electronic components L.

The processor 130 may calculate a product of the third current value and the internal resistance value as a third voltage value, add the preset reference voltage value to the third voltage value to set a maximum voltage value of the third voltage region, and subtract the preset reference voltage value from the third voltage value to set a minimum voltage value of the third voltage region.

Meanwhile, both the starting current and the operating current are currents output from the battery pack 1 but may have different current values. For example, the second current value of the starting current may be greater than the third current value of the operating current.

In addition, the minimum voltage value of the first voltage region may be greater than the maximum voltage value of the third voltage region, and the minimum voltage value of the third voltage region may be greater than the maximum voltage value of the second voltage region.

In other words, the processor 130 may set the first voltage region, the second voltage region and the third voltage region such that the minimum voltage value of the first voltage region is greater than the maximum voltage value of the third voltage region and the minimum voltage value of the third voltage region is greater than the maximum voltage value of the second voltage region.

The processor 130 may calculate a voltage change amount of the pack voltage value measured by the sensing unit 110. More specifically, the processor 130 may calculate a pack voltage value difference between the pack voltage value at a start point of a preset unit period and the pack voltage value at an end point of the preset unit period, at every preset unit period.

For example, the processor 130 may calculate a pack voltage value difference between an initially measured pack voltage value and a pack voltage value measured after the preset unit period, and then calculate a pack voltage value difference again by using a pack voltage value measured after another preset unit period.

Subsequently, the processor 130 may calculate an average of an n number of recently calculated pack voltage value differences among the calculated pack voltage value differences as the voltage change amount. Here, n may be a constant.

For example, if n is 3, the processor 130 may calculate an average of three recently calculated pack voltage value differences among the calculated pack voltage value differences as the voltage change amount. Through this, the processor 130 may accurately determine whether the battery pack 1 is in a charged or discharged state by updating the voltage change amount to the latest value.

Meanwhile, the processor 130 may compare the voltage change amount with the first voltage region, the second voltage region and the third voltage region, and determine whether the battery pack 1 is in a charged or discharged state based on the comparison result.

Specifically, as shown in FIG. 3, the processor 130 may determine that the battery pack 1 is in a charged state for receiving the charging current, if the voltage change amount is included in the first voltage region.

In addition, the processor 130 may determine that the battery pack 1 is in an operating discharged state for outputting an operating current to the electronic components L, if the voltage change amount is included in the third voltage region.

In addition, the processor 130 may determine that the battery pack 1 is in a starting discharged state for outputting a starting current to turn on the engine, if the voltage change amount is included in the second voltage region.

According to the present disclosure, it may be determined in detail whether the battery pack is in a charged state, a starting discharged state or an operating discharged state, without using an expensive current sensor.

Meanwhile, a processor 130' according to another embodiment may determine that the battery pack 1 is in a resting state after being started and discharged, if the voltage change amount is greater than the maximum voltage value of the first voltage region.

Through this, even when the battery pack 1 is in a resting state where the pack voltage value is suddenly boosted after being started and discharged to output a high current, the processor 130' according to another embodiment may not erroneously determine that the battery pack 1 is in a charged state where the pack voltage value is increased by receiving a charging current from the outside.

Meanwhile, the processor 130' according to another embodiment may determine that the battery pack 1 is in a naturally discharged state where the battery pack 1 is naturally discharged, if the voltage change amount is smaller than "0" and greater than the maximum voltage value of the third voltage region.

Through this, even when the battery pack 1 is in a naturally discharged state where the pack voltage value decreases due to natural discharge, the processor 130' according to another embodiment may not erroneously determine that the battery pack 1 is in a starting discharged state or an operating discharged state where the battery pack 1 is discharged by outputting the starting current or the operating current.

The processor 130' according to another embodiment may operate in a sleep mode, if it is determined that the battery pack 1 is in a resting state or in a naturally discharged state. Here, the sleep mode may mean a mode where the processor 130' waits for an operation without receiving power.

Meanwhile, the self-discharge circuit 120 may include a self-discharge resistor 121, a self-discharge switch 123, and a self-discharge path 122.

The self-discharge resistor 121 may be electrically connected in parallel to the cell assembly 1a. For this purpose, the self-discharge resistor 121 may be located on the self-discharge path 122 electrically connected to the charging and discharging path 1c.

The self-discharge switch 123 may be located on the self-discharge path 122 to electrically connect or disconnect the cell assembly 1a and the self-discharge resistor 121. The operation state of the self-discharge switch 123 may be controlled by the processor 130.

For example, if the self-discharge switch 123 is kept in the turn-on state and the charging and discharging switch 1b is kept in the turn-on state, the current output from or input to the cell assembly 1a may flow through the self-discharge resistor 121.

Conversely, if the self-discharge switch 123 is kept in the turn-off state and the charging and discharging switch 1b is kept in the turn-on state, the current output from the cell assembly 1a or input to the cell assembly 1a may flow through the charging and discharging switch 1b without passing through the self-discharge resistor 121.

The processor 130 may compare the pack voltage value and the reference voltage value and control the self-discharge switch 123 based on the comparison result. More specifically, the processor 130 may maintain the self-discharge switch 123 in a turn-on state, if the pack voltage value is greater than a reference voltage value. Here, the reference voltage value may refer to a voltage value at which battery pack 1 may be charged to the maximum in order to prevent overcharge of the battery pack 1.

Accordingly, if the processor 130 maintains the self-discharge switch 123 in a turn-on state, the current output from the cell assembly 1a or input to the cell assembly 1a may flow through the self-discharge resistor 121 so that the pack voltage value is maintained smaller than or equal to the reference voltage value.

Meanwhile, the processor 130, 130' may be is implemented in hardware by using at least one of application specific integrated circuits (ASICs), digital signal processors (DSPs), digital signal processing devices (DSPDs), programmable logic devices (PLDs), field programmable gate arrays (FPGAs), microcontrollers, and electrical units for performing other functions. The processor 130, 130' may have a built-in memory. In the memory, a program for executing a method explained later and various data may be stored. The memory may include, for example, at least type of storage media selected from a flash memory type, a hard disk type, a solid state disk (SSD) type, a silicon disk drive type, a multimedia card micro type, a random access memory (RAM), a static random access memory (SRAM), a read-only memory (ROM), an electrically erasable programmable read-only memory (EEPROM), and a programmable read-only memory (PROM).

The notification unit 140 may receive the charged or discharged state of the battery pack 1 from the processor 130, and output the charged or discharged state to the outside. More specifically, the notification unit 140 may include at least one of a display unit for displaying the charged or discharged state of the battery pack 1 by using at least one of symbols, numbers and codes, and a speaker device for outputting sound.

Hereinafter, a battery management method according to another embodiment of the present disclosure will be described.

Figure 4:
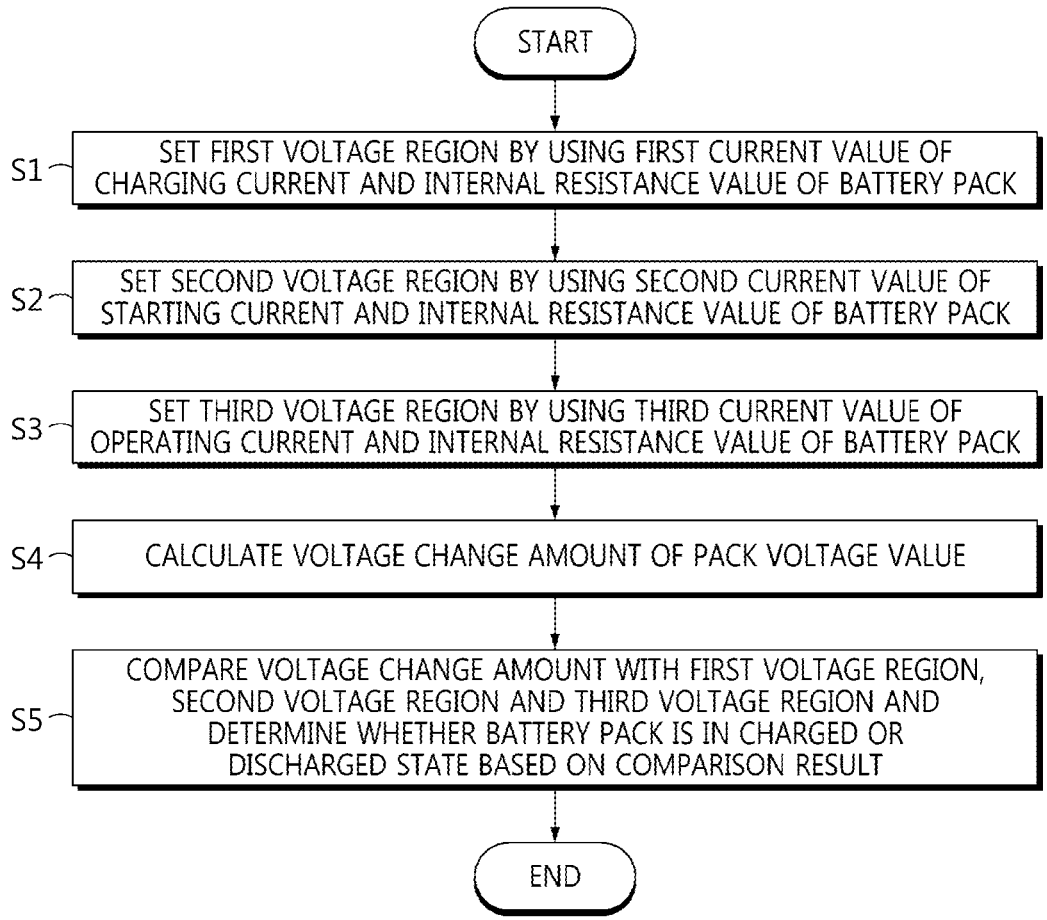
FIG. 4 is a flowchart for illustrating a battery management method according to another embodiment of the present disclosure.

FIG. 4 is a flowchart for illustrating a battery management method according to another embodiment of the present disclosure.

Referring to FIG. 4, the battery management method according to another embodiment of the present disclosure may use the battery management apparatus 100 (FIG. 1) according to an embodiment.

First, in the step S1, the processor 130 may set the first voltage region by using the first current value of the charging current generated from the engine and the internal resistance value of the battery pack 1.

In the step S2, the processor 130 may set the second voltage region by using the second current value of the starting current output to the starting motor L to turn on the engine and the internal resistance value of the battery pack 1.

In the step S3, the processor 130 may set the third voltage region by using the third current value of the operating current output to operate the electronic components L and the internal resistance value of the battery pack 1.

In the step S4, the processor 130 may calculate the voltage change amount of the pack voltage value measured by the sensing unit 110.

In this case, in the step S4, the processor 130 may calculate the pack voltage value difference between the pack voltage value at the start point of the preset unit period and the pack voltage value at the end point of the preset unit period, at every preset unit period.

In addition, in the step S4, the processor 130 may calculate the average of the n number of recently calculated pack voltage value differences among the calculated pack voltage value differences as the voltage change amount.

Subsequently, in the step S5, the processor 130 may compare the voltage change amount with the first voltage region, the second voltage region and the third voltage region, and determine whether the battery pack 1 is in a charged or discharged state based on the comparison result.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, the present disclosure described above may be substituted, modified and changed in various ways by a person skilled in the art without departing from the technical scope of the present disclosure. Thus, the present disclosure is not limited by the embodiments described above and the accompanying drawings, and all or some of the embodiments may be selectively combined to enable various modifications.

REFERENCE SIGNS

1: battery pack
100: battery management apparatus
110: sensing unit
120: self-discharge circuit
130, 130': processor
140: notification unit

What is claimed is:

1. A battery management apparatus, comprising:
a sensing unit configured to measure a pack voltage value of a battery pack that is configured to:
be charged by receiving a charging current generated from an engine;
output a starting current to turn on the engine; and
output an operating current to operate electronic components; and
a processor operably coupled to the sensing unit, the processor being configured to:
set a first voltage region by using a first current value of the charging current and an internal resistance value of the battery pack;
set a second voltage region by using a second current value of the starting current and the internal resistance value of the battery pack;
set a third voltage region by using a third current value of the operating current and the internal resistance value of the battery pack;
calculate a voltage change amount of the pack voltage value;
compare the first voltage region, the second voltage region, and the third voltage region with the voltage change amount; and
determine whether the battery pack is in a charged or discharged state based on the comparison result.

2. The battery management apparatus according to claim 1, wherein the processor is further configured to calculate a pack voltage value difference between the pack voltage value at a start point of a preset unit period and the pack voltage value at an end point of the preset unit period, at every preset unit period.

3. The battery management apparatus according to claim 2, wherein the processor is further configured to calculate an average of an n number of recently calculated pack voltage value differences among the calculated pack voltage value differences as the voltage change amount.

4. The battery management apparatus according to claim 1, wherein the processor is further configured to determine that the battery pack is in a charged state for receiving the charging current, when the voltage change amount is included in the first voltage region.

5. The battery management apparatus according to claim 1, wherein the processor is further configured to determine that the battery pack is in an operating discharged state for outputting the operating current to the electronic components, when the voltage change amount is included in the third voltage region.

6. The battery management apparatus according to claim 1, wherein the processor is further configured to determine that the battery pack is in a starting discharged state for outputting the starting current to turn on the engine, when the voltage change amount is included in the second voltage region.

7. The battery management apparatus according to claim 1, wherein:
a minimum voltage value of the first voltage region is greater than a maximum voltage value of the third voltage region; and
a minimum voltage value of the second voltage region is greater than a maximum voltage value of the second voltage region.

8. A battery pack, comprising the battery management apparatus according to claim 1.

9. A vehicle, comprising the battery management apparatus according to claim 1.

10. A battery management method, which uses a battery management apparatus including: a sensing unit configured to measure a pack voltage value of a battery pack that is charged by receiving a charging current generated from an engine, outputs a starting current to turn on the engine, and outputs an operating current to operate electronic components; and a processor operably coupled to the sensing unit, the battery management method comprising:
by the processor, setting a first voltage region by using a first current value of the charging current and an internal resistance value of the battery pack;
by the processor, setting a second voltage region by using a second current value of the starting current and the internal resistance value of the battery pack;
by the processor, setting a third voltage region by using a third current value of the operating current and the internal resistance value of the battery pack;
by the processor, calculating a voltage change amount of the pack voltage value; and
by the processor, comparing the first voltage region, the second voltage region, and the third voltage region with the voltage change amount, and determining whether the battery pack is in a charged or discharged state based on the comparison result.

* * * * *